United States Patent [19]

Hsu et al.

[11] Patent Number: 5,453,635

[45] Date of Patent: Sep. 26, 1995

[54] LIGHTLY DOPED DRAIN TRANSISTOR DEVICE HAVING THE POLYSILICON SIDEWALL SPACERS

[75] Inventors: Chen-Chung Hsu, Taichung; Gary Hong, Hsinchu, both of Taiwan

[73] Assignee: United Microelectronics Corp., Hsinchu City, Taiwan

[21] Appl. No.: 358,752

[22] Filed: Dec. 19, 1994

Related U.S. Application Data

[62] Division of Ser. No. 294,569, Aug. 23, 1994.

[51] Int. Cl.$^6$ .................................................. H01L 29/78
[52] U.S. Cl. .......................... 257/336; 257/344; 257/408; 257/330; 257/900
[58] Field of Search ............................ 257/336, 344, 257/408, 409, 329, 330, 332, 333, 334, 382, 384, 388, 622, 900

[56] References Cited

U.S. PATENT DOCUMENTS 5,386,133  1/1995  Hiroki et al. ........................ 257/344

FOREIGN PATENT DOCUMENTS 63-287064  11/1988  Japan .................................. 257/344
1-108774   4/1989   Japan .................................. 257/330
2-23669    1/1990   Japan .................................. 257/332

*Primary Examiner*—William Mintel
*Assistant Examiner*—Minhloan Tran
*Attorney, Agent, or Firm*—Ladas & Parry

[57] ABSTRACT

A lightly doped drain (LDD) transistor device structure and a method of fabricating same are described. A silicon substrate is provided which has a trench formed therein. Polysilicon sidewall spacers are formed on the side walls of the trench. Silicon dioxide sidewall spacers are formed on the side walls of the polysilicon sidewall spacers. A gate oxide layer is formed on the bottom of the trench by oxidation. A polysilicon gate layer is formed filling the trench. Impurities are implanted into the silicon substrate to simultaneously form heavily doped source/drain areas in spaced apart portions of the silicon substrate adjacent to the polysilicon sidewall spacers to improve the conductivity of the polysilicon gate layer, and form lightly doped source/drain areas in spaced apart portions of the silicon substrate under the silicon dioxide sidewall spacers.

4 Claims, 3 Drawing Sheets

5,453,635

LIGHTLY DOPED DRAIN TRANSISTOR DEVICE HAVING THE POLYSILICON SIDEWALL SPACERS

This is a divisional of application Ser. No. 08/294,569 filed Aug. 23, 1994.

BACKGROUND OF THE INVENTION

1. Field of the Invention

This invention relates to the manufacture of integrated circuit (IC) devices, and more particularly to an improved lightly doped drain (LDD) transistor device as well as a method of fabricating the same by one ion implantation process.

2. Description of the Prior Art

In submicron transistors, hot electron injection into the gate is a serious reliability problem. Many structures and processes have been proposed in the attempt to design a high speed VLSI manufacturable submicron MOS transistor which exhibits resistance to hot electron degradation.

One such device is the lightly doped drain (LDD) transistor. FIGS. 1A to 1C show, in cross sectional views, the process steps of a prior art LDD transistor. As shown in FIG. 1A, a gate electrode including a gate oxide layer 11 and a polysilicon gate layer 12 is formed on a P type silicon substrate 10. An ion implantation process is performed, which introduces N type impurities, such as arsenic ions, into the polysilicon gate layer 12, so as to increase its conductivity. Next, as shown in FIG. 1B, N type impurities, such as phosphorous ions, are implanted into the P type silicon substrate 10 by using the gate electrode as a mask to form lightly doped $N^-$ source/drain areas 13. Referring to FIG. 1C, sidewall spacers 14 are formed on the side walls of the gate electrode. Other N type impurities, such as arsenic ions, are implanted into the P type silicon substrate 10 using the gate electrode and the sidewall spacers 14 as masks to form heavily doped $N^+$ source/drain areas 15 completing the prior art LDD transistor. The peak electric field of the transistor is decreased by forming lightly doped $N^-$ source/drain areas 13, thereby increasing the transistor's resistance to hot electron degradation.

However, this technique has some drawbacks. First, as be described above, three ion implantation steps are performed in fabricating a prior art LDD transistor, i.e. (i) to increase the conductivity of the polysilicon gate layer 12, (ii) to form lightly doped $N^-$ source/drain areas 13, and (iii) to form heavily doped $N^+$ source/drain areas 15. The implantation steps increase the complexity and cycle time for manufacturing the device. Second, the $N^+$ source/drain areas 15 have a deeper junction depth than do the $N^-$ source/drain areas 13. As the sizes of devices is reduced with increases in packing densities, the reliability of the transistor is worsen due to punch-through effects.

It is therefore an object of the present invention to provide a transistor device structure having substantially the same junction depth in both heavily doped source/drain areas and in lightly doped source/drain areas to prevent punchthrough effects.

It is another object of the present invention is to provide a method of fabricating an LDD transistor device, which can form both heavily doped source/drain areas and lightly doped source/drain areas and also improve the conductivity of the gate layer in one ion implantation step.

SUMMARY OF THE INVENTION

In accordance with one object of the present invention, an improved LDD transistor device structure is provided. The transistor device comprises: a silicon substrate having a trench formed therein; a gate electrode formed on the central portion of the trench, wherein the gate electrode includes a gate oxide layer and a polysilicon gate layer; silicon dioxide sidewall spacers formed on the side walls of the gate electrode; polysilicon sidewall spacers formed on the side walls of the silicon dioxide sidewall spacers, wherein the trench is filled with the gate electrode, the silicon dioxide sidewall spacers, and the polysilicon sidewall spacers; lightly doped source/drain areas formed apart in portions of the silicon substrate under the silicon dioxide sidewall spacers; and heavily doped source/drain areas formed apart in portions the silicon substrate adjacent to the polysilicon sidewall spacers.

In accordance with another object of the present invention, a new method of fabricating an LDD transistor device is achieved. Polysilicon sidewall spacers are formed on the side walls of a trench in a silicon substrate. Silicon dioxide sidewall spacers are formed on the side walls of the polysilicon sidewall spacers. A gate oxide layer is formed on the bottom of the trench by oxidation, and a thin silicon dioxide layer may be formed on the surface of the silicon substrate simultaneously. A polysilicon gate layer is formed to fill the trench. Impurities are implanted into the silicon substrate to form heavily doped source/drain areas apart in portions the silicon substrate adjacent to the polysilicon sidewall spacers and improve the conductivity of the polysilicon gate layer, wherein lightly doped source/drain areas are formed apart in portions of the silicon substrate under the silicon dioxide sidewall spacers simultaneously.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

Figure 1A:
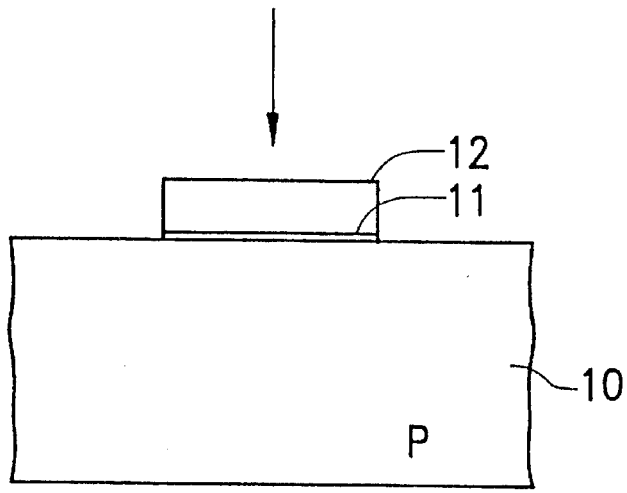
FIGS. 1A to 1C illustrate, in cross sectional view, process steps of a prior art LDD transistor device.
Figure 1B:
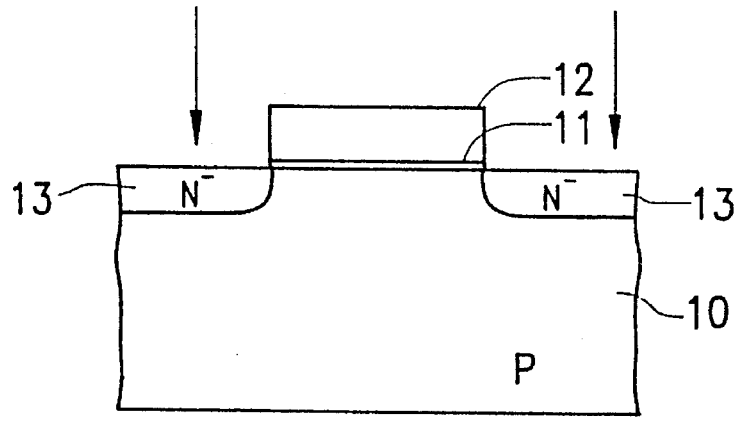
Figure 1C:
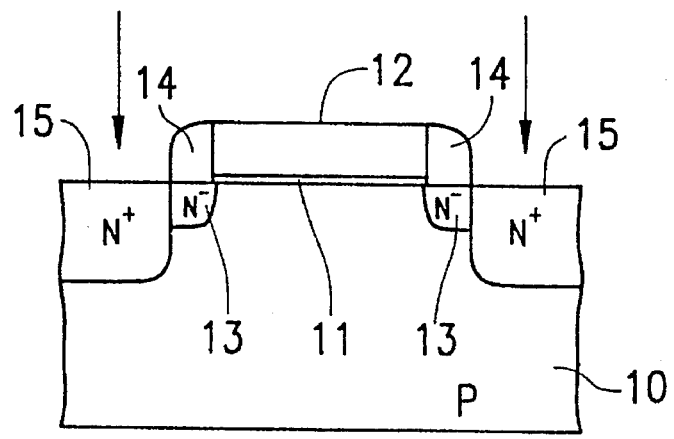
Figure 2A:
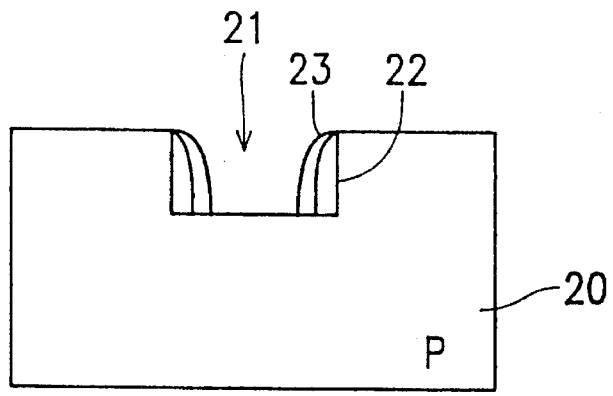
FIGS. 2A to 2E illustrate, in cross sectional view, process steps in accordance with one embodiment of the present invention.

Referring to FIG. 2A, there is shown a semiconductor substrate, such as a P type silicon substrate 20. A trench 21 of a depth of between 2500 Å to 3000 Å is formed in the silicon substrate 20 by using anisotropic etching, such as reactive ion etching (RIE). A polysilicon layer is deposited over the surface of the trench 21 and silicon substrate 20 by chemical vapor deposition (CVD). The polysilicon layer is then etched back by RIE to leave polysilicon sidewall spacers 22 on the side walls of the trench 21. Silicon dioxide sidewall spacers 23 are next formed on the side walls of the polysilicon sidewall spacers 22 by CVD and etching back with RIE as described above.

Figure 2B:
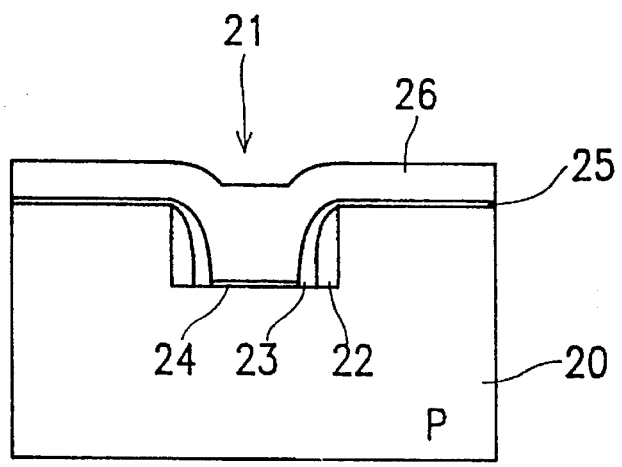

Referring to FIG. 2B, a gate oxide layer 24 is formed on the bottom of the trench 21 by thermal oxidation or CVD. Meanwhile, a thin silicon dioxide layer 25 is also formed on the exposed surface of the silicon substrate 20. Next, a polysilicon layer 26 with thickness of about 5000 Å is formed on the gate oxide layer 24, silicon dioxide sidewall spacers 23, and the thin silicon dioxide layer 25 by CVD, so as to fill the trench 21.

Figure 2C:
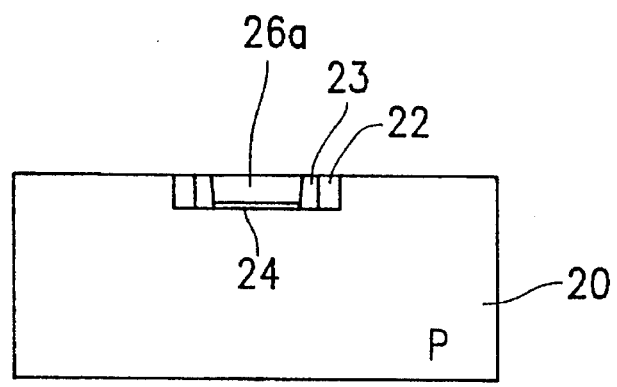

Referring to FIG. 2C, the top portions of polysilicon layer 26, silicon dioxide sidewall spacers 23, and polysilicon sidewall spacers 22, as well as the thin silicon dioxide layer are removed by chemical mechanical polishing (CMP) to expose the silicon substrate 20. The remaining portion of the polysilicon layer 26 within the trench 21 forms a polysilicon gate layer 26a which has a thickness of between 2000 Å to 2500 Å.

Figure 2D:
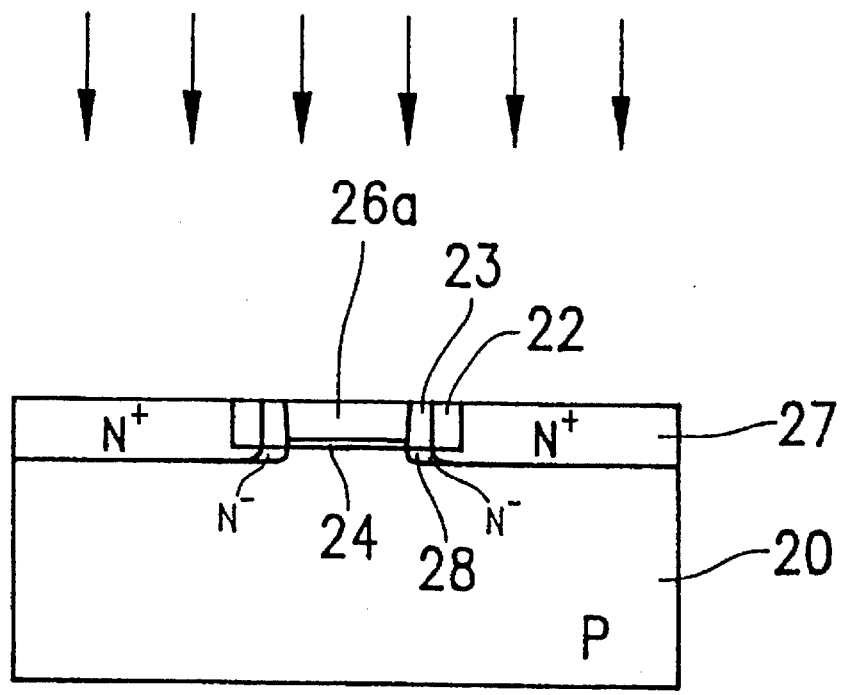

Referring to FIG. 2D, N type impurities are implanted into the P type silicon substrate 20. Thus, the conductivity of polysilicon gate layer 26a is improved, and heavily doped $N^+$ source/drain areas 27 are formed apart in portions of the silicon substrate 20 adjacent to the polysilicon sidewall spacers 22. Meanwhile, lightly doped $N^-$ source/drain areas 28 are formed apart in portions of the silicon substrate 20 under the silicon dioxide sidewall spacers 23 by side diffusion. The N type impurities, for example, are arsenic ions with energy of about 50 KeV and dosage of about $2\times10^{15}$ atoms/cm$^2$, or phosphorous ions with energy of about 30 KeV and dosage of about $2\times10^{15}$ atoms/cm$^2$.

Hence, a process of fabricating an improved LDD transistor device according to the present invention is described. Since both heavily doped $N^+$ source/drain areas 27 and lightly doped $N^-$ source/drain areas 28 have substantially the same junction depth, the punchthrough effect can be prevented. Besides, with one ion implantation process, both heavily doped $N^+$ source/drain areas 27 and lightly doped $N^-$ source/drain areas 28 are formed, and the conductivity of gate layer 26a is improved, simultaneously. Obviously, the complexity and cycle time for manufacturing the device can be reduced.

Figure 2E:
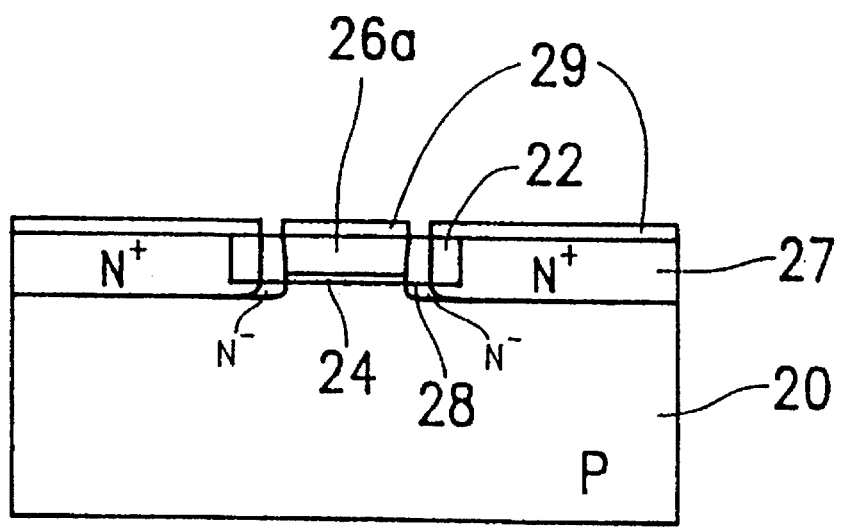

Furthermore, in order to reduce the sheet resistance, a metal silicide layer, such as a titanium silicide ($TiSi_2$) layer 29, is formed on the surface of the heavily doped $N^+$ source/drain areas 27, the polysilicon sidewall spacers 22, and the polysilicon gate layer 26a by a conventional self-aligned process, as shown in FIG. 2E.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A lightly doped drain transistor device, comprising;

a silicon substrate having a trench formed therein;

a gate electrode formed on a central portion of said trench, wherein said gate electrode includes a gate oxide layer and a polysilicon gate layer;

silicon dioxide sidewall spacers formed on side walls of said gate electrode;

polysilicon sidewall spacers formed on the side walls of said silicon dioxide sidewall spacers, wherein said trench is filled with said gate electrode, said silicon dioxide sidewall spacers, and said polysilicon sidewall spacers;

lightly doped source/drain areas formed in spaced apart portions of said silicon substrate under said silicon dioxide sidewall spacers; and heavily doped source/drain areas formed in spaced apart portions of said silicon substrate adjacent to said polysilicon sidewall spacers.

2. The lightly doped drain transistor device of claim 1, further comprising a metal silicide layer formed overlying said gate electrode, said polysilicon sidewall spacers, and said heavily doped source/drain areas.

3. The lightly doped drain transistor device of claim 2, said metal silicide layer is a titanium silicide layer.

4. The lightly doped drain transistor device of claim 1, wherein the depth of said heavily doped source/drain areas are substantially the same as that of said lightly doped source/drain areas.

* * * * *